(12) United States Patent
Hohage et al.

(10) Patent No.: US 7,491,638 B2
(45) Date of Patent: *Feb. 17, 2009

(54) METHOD OF FORMING AN INSULATING CAPPING LAYER FOR A COPPER METALLIZATION LAYER

(75) Inventors: Joerg Hohage, Dresden (DE); Matthias Lehr, Dresden (DE); Volker Kahlert, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 156 days.

This patent is subject to a terminal disclaimer.

(21) Appl. No.: 11/383,824

(22) Filed: May 17, 2006

(65) Prior Publication Data

US 2007/0037388 A1 Feb. 15, 2007

(30) Foreign Application Priority Data

Jul. 29, 2005 (DE) .............. 10 2005 035 740

(51) Int. Cl.
*H01L 21/4763* (2006.01)

(52) U.S. Cl. .............. 438/635; 438/687; 257/E21.575

(58) Field of Classification Search ........... 438/618, 438/622, 624, 628, 644, 687, 635, 633; 257/E21.575
See application file for complete search history.

(56) References Cited

U.S. PATENT DOCUMENTS

| | | | |
|---|---|---|---|
| 5,447,887 A * | 9/1995 | Filipiak et al. .............. 438/644 |
| 6,179,198 B1 | 1/2001 | Eifuku et al. |
| 6,219,910 B1 | 4/2001 | Murali .......................... 29/840 |
| 6,429,128 B1 * | 8/2002 | Besser et al. ................. 438/687 |
| 6,599,827 B1 | 7/2003 | Ngo et al. .................... 438/627 |
| 6,797,652 B1 * | 9/2004 | Ngo et al. .................... 438/687 |
| 6,852,373 B1 | 2/2005 | Motte et al. .................. 427/579 |
| 6,939,797 B2 | 9/2005 | Barth et al. .................. 438/628 |
| 2003/0045086 A1 | 3/2003 | Noguchi et al. ............. 438/621 |
| 2003/0072695 A1 | 4/2003 | Ruelke et al. ............... 422/186 |
| 2003/0134495 A1 | 7/2003 | Gates et al. ................. 438/600 |
| 2003/0224599 A1 | 12/2003 | Zistl et al. ................... 438/678 |
| 2003/0228750 A1 | 12/2003 | Lee et al. .................... 438/623 |
| 2004/0038550 A1 | 2/2004 | Chen et al. .................. 438/740 |
| 2004/0130030 A1 | 7/2004 | Kunimune et al. .......... 257/758 |
| 2004/0150113 A1 | 8/2004 | Tonegawa .................... 257/758 |
| 2004/0266171 A1 | 12/2004 | Aoki et al. ................... 438/622 |

OTHER PUBLICATIONS

Office Action dated Nov. 1, 2007 from related U.S. Appl. No. 11/531,084.
Office Action dated Mar. 26, 2008 from related U.S. Appl. No. 11/531,084.
Office Action dated Jun. 26, 2008 from related U.S. Appl. No. 11/531,084.
Office Action dated Nov. 3, 2008 from related U.S. Appl. No. 11/531,084.

* cited by examiner

*Primary Examiner*—Brook Kebede
(74) *Attorney, Agent, or Firm*—Williams, Morgan & Amerson, P.C.

(57) ABSTRACT

A new technique is disclosed in which a barrier/capping layer for a copper-based metal line is formed by using a thermal-chemical treatment followed by an in situ plasma-based deposition of silicon nitride and/or silicon carbon nitride. The thermal-chemical treatment is performed on the basis of an ammonium/nitrogen mixture in the absence of any plasma ambient.

17 Claims, 4 Drawing Sheets

METHOD OF FORMING AN INSULATING CAPPING LAYER FOR A COPPER METALLIZATION LAYER

BACKGROUND OF THE INVENTION

1. Field of the Invention

Generally, the present invention relates to the formation of integrated circuits, and, more particularly, to the formation of metallization layers including highly conductive metals, such as copper, embedded into a dielectric material including a capping layer acting as an efficient diffusion barrier layer for the metal.

2. Description of the Related Art

In modern integrated circuits, minimum feature sizes, such as the channel length of field effect transistors, have reached the deep sub-micron range, thereby steadily increasing performance of these circuits in terms of speed and/or power consumption. As the size of the individual circuit elements is significantly reduced, thereby improving, for example, the switching speed of the transistor elements, the available floor space for interconnect lines electrically connecting the individual circuit elements is also decreased. Consequently, the dimensions of these interconnect lines have to be reduced to compensate for a reduced amount of available floor space and for an increased number of circuit elements provided per chip.

In integrated circuits having minimum dimensions of approximately 0.35 μm and less, a limiting factor of device performance is the signal propagation delay caused by the switching speed of the transistor elements. As the channel length of these transistor elements has now reached 0.1 μm and significantly less, it turns out, however, that the signal propagation delay is no longer limited by the field effect transistors, but is limited, owing to the increased circuit density, by the close proximity of the interconnect lines, since the line-to-line capacitance is increased in combination with a reduced conductivity of the lines due to their reduced cross-sectional area. The parasitic RC time constants therefore require the introduction of a new type of materials for forming the metallization layer.

Traditionally, metallization layers are formed by a dielectric layer stack including, for example, silicon dioxide and/or silicon nitride with aluminum as the typical metal. Since aluminum exhibits significant electromigration at higher current densities than may be necessary in integrated circuits having extremely scaled feature sizes, aluminum is being replaced by copper, which has a significantly lower electrical resistance and a higher resistivity against electromigration. For highly sophisticated applications, in addition to using copper and/or copper alloys, the well-established and well-known dielectric materials silicon dioxide (k≈4.2) and silicon nitride (k>5) may be replaced by so-called low-k dielectric materials. However, the transition from the well-known and well-established aluminum/silicon dioxide metallization layer to a copper-based metallization layer, possibly in combination with a low-k dielectric material, is associated with a plurality of issues to be dealt with.

For example, copper may not be deposited in relatively high amounts in an efficient manner by well-established deposition methods, such as chemical and physical vapor deposition. Moreover, copper may not be efficiently patterned by well-established anisotropic etch processes. Therefore, the so-called damascene technique is frequently employed in forming metallization layers including copper lines. Typically, in the damascene technique, the dielectric layer is deposited and then patterned with trenches and vias that are subsequently filled with copper by plating methods, such as electroplating or electroless plating. Although the damascene technique is presently a well-established technique for forming copper-based metallization layers in standard dielectric materials, such as silicon dioxide and a plurality of low-k dielectrics, a dielectric diffusion barrier layer has to be provided on top of the copper-based region as copper readily diffuses in a plurality of dielectrics, such as silicon dioxide and in many low-k dielectrics. Moreover, the diffusion of moisture and oxygen into the copper-based metal has to be suppressed as copper readily reacts to form oxidized portions, thereby possibly deteriorating the characteristics of the copper-based metal line with respect to adhesion, conductivity and the resistance against electromigration. For instance, silicon nitride is known as an effective copper diffusion barrier and may be used as a capping layer. In other cases, when the moderately high permittivity of silicon nitride is considered inappropriate, nitrogen enriched silicon carbide (SiCN) is frequently used as a copper diffusion barrier. Despite the diffusion hindering effect of the silicon nitride capping layers and silicon carbide-based capping layers, it turns out, however, that copper's resistance against electric current-induced material transport (electromigration) strongly depends on the characteristics of an interface between the copper-based metal and the adjacent capping layer. Therefore, in sophisticated integrated circuits featuring high current densities, it is generally preferable to design the deposition process for the capping layer such that a desired high adhesion and thus high performance with respect to electromigration is achieved. For this purpose, corresponding deposition techniques with preceding plasma-based cleaning steps are typically used.

With reference to FIGS. 1a-1b, a typical conventional process flow for forming a SiCN capping layer will now be described in more detail. FIG. 1a schematically shows a cross-sectional view of a semiconductor device 100 prior to the formation of a silicon nitride or silicon carbide nitride based capping layer on a copper-containing metal region. The semiconductor device 100 comprises a substrate 101 that may include circuit elements, such as transistors, capacitors and the like, which for convenience are not shown. Moreover, the substrate may have formed thereon one or more metallization layers, i.e., dielectric layers in which are embedded metal-filled lines and vias to establish the required electrical connections between the individual circuit elements. For convenience, a single copper-based metal region 103 is illustrated to represent any copper-based metal lines of one or more metallization layers. The copper-based metal region 103 may be embedded in any appropriate dielectric material, such as silicon dioxide, fluorine-doped silicon dioxide, a low-k material such as hydrogen enriched silicon oxycarbide (SiCOH), or any combination thereof. As previously explained, the copper may readily diffuse in a plurality of dielectric materials and hence a conductive barrier layer 102 is typically provided between the dielectric material of the substrate 101 and the copper-containing material of the region 103. The barrier layer 102 may be comprised of two or more individual layers to provide the required characteristics, not only in view of the copper diffusion blocking effect, but also with respect to adhesion to the surrounding material and the like. For example, tantalum, tantalum nitride, titanium, titanium nitride, and combinations thereof, are frequently used for appropriate materials for the barrier layer 102.

A typical process flow for forming the semiconductor device 100 as shown in FIG. 1a may comprise the following processes. After the formation of any circuit elements, which may exhibit extremely scaled critical dimensions in sophisticated applications, such as a gate length of field effect transistors in the range of approximately 50-100 nm and even less, one or more metallization layers may be formed in accordance with well-established single damascene or dual damascene techniques. That is, an appropriate dielectric layer stack including an etch stop/barrier layer, similar to the capping layer that is to be formed on top of the copper-based metal region 103, may be deposited followed by another dielectric layer, such as silicon dioxide or a low-k dielectric material, which may be formed by well-established technique, such as plasma enhanced chemical vapor deposition (PECVD), spin-on techniques and the like.

Thereafter, the dielectric layer stack may be patterned by photolithography and etch techniques to form trenches and vias in the dielectric layer stack, wherein the lower etch stop/barrier or capping layer (not shown) may be used as an etch stop. For convenience, only a single trench may be considered for the further description, in which the copper-based metal region 103 is to be formed. Thus, after the patterning of the corresponding trench, the barrier layer 102 may be deposited on the basis of well-established deposition techniques, such as sputter deposition, chemical vapor device (CVD), atomic layer deposition (ALD), and the like. For instance, well-established recipes for the sputter deposition of tantalum and tantalum nitride, as well as titanium and titanium nitride, may be used to form the barrier layer 102 having the desired characteristics.

Thereafter, a seed layer (not shown) comprised of, for instance, copper may be formed by sputter deposition or any other appropriate deposition technique. Based on the seed layer, a copper-based material, such as pure copper, a copper alloy or any combination thereof, may be deposited by, for instance, electroplating, thereby reliably filling the previously formed trenches and vias and also forming the copper-based metal region 103. Next, excess material deposited during the preceding electrochemical deposition process, as well as the seed layer and the conductive barrier layer 102 formed on portions outside the copper-based metal region 103, may be removed to provide the electrically insulated copper-based metal region 103. For this purpose, a removal process typically comprising a chemical mechanical polishing (CMP) process may be performed during which a surface 103a of the region 103 is exposed, which may thus be subjected to any chemical reactions, resulting in discolored and eroded or oxidized portions on the surface 103a, since copper may readily react with moisture, oxygen and other traces of gases that may typically be encountered during the removal of the excess material and subsequent substrate handling processes.

Consequently, prior to the formation of an insulating capping layer, which may also act as an etch stop layer for the formation of any further metallization layers on top of the substrate 101, the surface 103a is typically cleaned in order to enhance conductivity and the adhesion characteristics and thus the electromigration behavior of the region 103. To this end, a plasma-based treatment may be performed to efficiently remove oxidized, discolored and eroded portions on the surface 103a while at the same time substantially avoiding reformation of these portions. For example, a plasma ambient 104 may be established on the basis of ammonia ($NH_3$) and nitrogen ($N_2$), wherein the plasma ignition is typically performed on the basis of radio frequency (RF), the power density of which may significantly determine, in combination with the gas flows of ammonia and nitrogen, the effectiveness of the plasma treatment 104. For instance, with appropriately selected gas flows in the range of approximately 500-600 sccm and 6000 sccm for ammonia and nitrogen, respectively, and an RF power of 200 watts for a plasma deposition chamber such as the Producer™ available from Applied Materials Corporation, a good adhesion for a silicon carbide nitride (SiCN) layer may be obtained. After the plasma treatment 104, the ambient may be changed by applying appropriate precursor materials so that an appropriate deposition atmosphere may be established in situ, thereby avoiding undue discoloration and oxidation on the exposed surface 103a. After a corresponding stabilization step for introducing the precursor gases, such as 3MS (tri-methylsilane) and ammonia for forming a silicon carbide nitride layer, an appropriate RF power may be supplied to establish a corresponding plasma, thereby initiating the deposition process.

FIG. 1b schematically shows the semiconductor device 100 during this deposition step, wherein, on the basis of the plasma 105 containing 3MS and $NH_3$, a capping layer 106 comprised of nitrogen enriched silicon carbide (SiCN) is formed above the substrate 101 and on the exposed surface 103a, thereby creating a corresponding interface, which is, for convenience, also referred to as 103a. Thereafter, the further processing may be continued by forming further metallization layers, wherein the capping layer 106 may act as an etch stop layer for patterning a corresponding dielectric layer stack for forming corresponding vias and trenches.

During the operation of the device 100, the current-induced material transport, also referred to as electromigration, at the interface 103a may nevertheless reach critical values, especially when a copper-based metal region 103 is part of a higher metallization layer. Thus, for sophisticated applications requiring increased current densities, the resistance with respect to electromigration provided by the conventional process flow may no longer be appropriate.

In view of the situation described above, there exists a need for an enhanced technique that enables the formation of copper-based metallization layers including an efficient capping layer with enhanced resistance against electromigration.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of an insulating barrier or capping layer for a copper-based metal region, wherein an exposed surface of the copper region is pretreated on the basis of a thermal-chemical reaction rather than a plasma treatment, thereby significantly improving the interface between the exposed copper surface and a subsequent in situ deposited capping layer. Consequently, improved characteristics with respect to, for instance, electromigration may be achieved while, on the other hand, a significantly reduced process time is obtained compared to conventionally manufactured capping layers with a plasma-treated copper surface.

According to one illustrative embodiment of the present invention, a method comprises forming a copper-based metal region in a dielectric layer of a metallization layer of a semiconductor device, wherein the copper-based metal region has an exposed surface. Moreover, the exposed surface is cleaned by means of a thermal-chemical treatment in a specified environment. Finally, a capping layer is deposited on the exposed surface within the specified environment.

In accordance with another illustrative embodiment of the present invention, a method comprises providing a semiconductor device comprising a substrate having formed thereon a copper-based metal region having an exposed surface. Furthermore, the exposed surface is pretreated in the absence of a plasma ambient to prepare the exposed surface for receiving a capping layer thereon. Finally, the capping layer is deposited in situ in the presence of a deposition plasma ambient.

BRIEF DESCRIPTION OF THE DRAWINGS

The invention may be understood by reference to the following description taken in conjunction with the accompanying drawings, in which like reference numerals identify like elements, and in which.

Figure 1A:
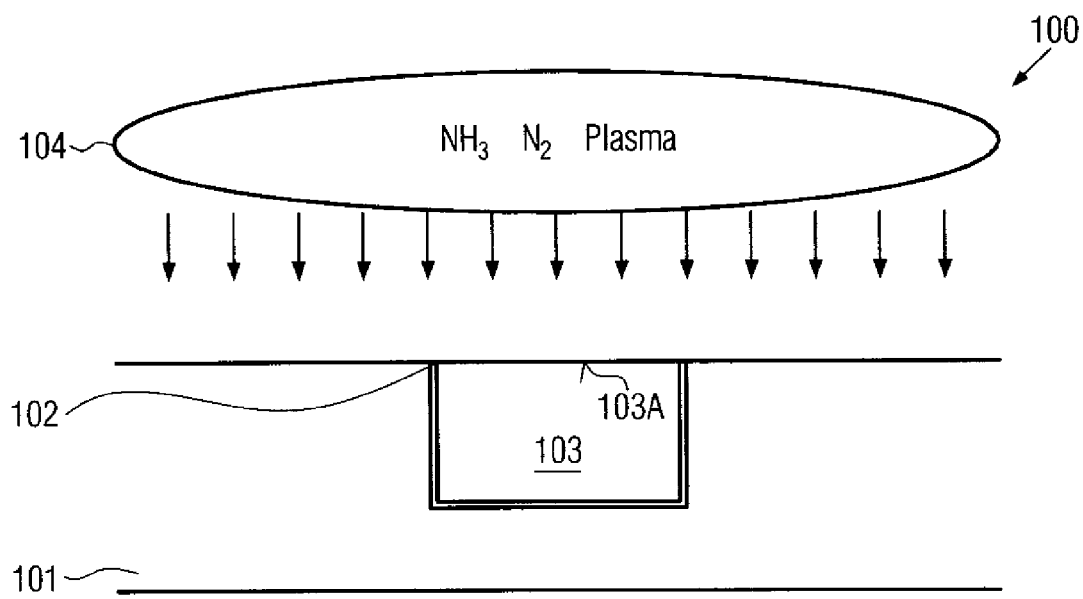
FIGS. 1a-1b schematically show cross-sectional views of a conventional semiconductor device during the formation of a nitrogen enriched silicon carbide (SiCN) capping layer, wherein an exposed copper surface is pre-cleaned by means of a plasma treatment.
Figure 1B:
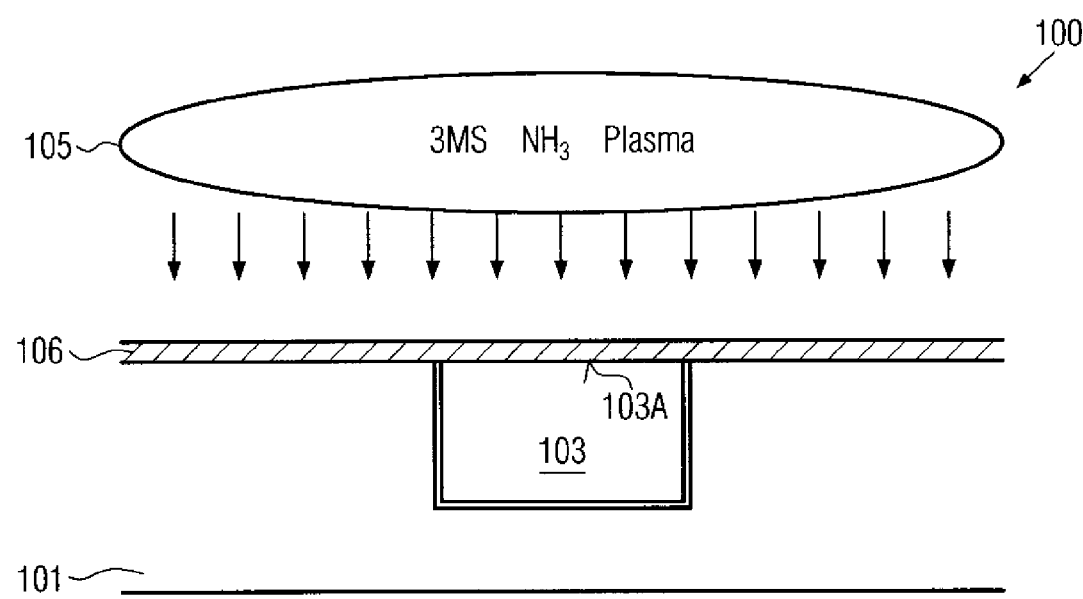

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention contemplates a new technique for the formation of a dielectric barrier or capping layer for exposed copper-based metal regions, such as metal lines as are typically used in sophisticated semiconductors including copper-based metallization layers, possibly in combination with low-k dielectric materials, wherein moderately high current densities and operating temperatures may be encountered in the metal lines during the operation of the devices. As previously explained, stress-induced material transport phenomena in conductive lines may significantly influence the overall reliability and lifetime of semiconductor devices, as the failure of even one single conductive line within the metallization layer may cause a failure of the device or may at least reduce the reliability thereof. Material transport in metal lines, such as electromigration, which describes the phenomenon of copper diffusion induced by an electric flow in a metal line and thus creating voids and hillocks in the metal line, may significantly depend on the characteristics of diffusion paths that are typically formed at interfaces between two different material layers. Recent investigation seems to confirm that the characteristics of the interface between copper-based metal and the capping layer, which is typically based on silicon and/or carbon and/or nitrogen, may have a strong influence on the copper-based metal line's resistance against electromigration. Thus, conventionally, the exposed copper-based surface is cleaned by a plasma treatment prior to the actual deposition so as to efficiently remove copper oxide in order to achieve good adhesion on copper. For instance the coefficient $G_c$, indicating the adhesion "strength" of a material on a substrate, is greater than 20 $J/m^2$ for a typical conventional silicon carbide nitride capping layer formed on the basis of a plasma-based cleaning treatment. However, as previously noted, the electromigration at a copper/SICN interface can nevertheless reach critical values, especially in higher metallization levels, thereby rendering a corresponding metallization less reliable for highly sophisticated applications. Moreover, a silicon nitride layer may not be a desirable alternative in conventional techniques, since a conventional ammonia/nitrogen based plasma pretreatment is critical, as silane, i.e., the precursor of the silicon nitride deposition process, diffuses readily into the plasma cleaned copper surface, which is also heated by the interaction with the plasma, thereby resulting in a copper silicide formation that may not be controlled and thus significantly affecting the resulting characteristics of the capping layer/copper interface in a non-predictable manner.

According to the principles of the present invention, the pretreatment of the exposed copper-based surface is performed in the absence of a plasma ambient, thereby resulting in a highly efficiently cleaned copper surface with a significantly reduced amount of surface irregularities, such as copper silicide, hillocks and the like. In this respect, the term "in the absence of a plasma ambient" is to be understood that the treatment is performed substantially on the basis of a chemical reaction, which is thermally activated by the heated surface, in a gaseous environment, wherein the gas components have a non-directional thermal motion with a fraction of ionized particles that corresponds to the fraction created by the mutual interaction of the gaseous components without applying an external electromagnetic field. Thus, "in the absence of a plasma ambient" is to be understood such that plasma-induced effects, if any external electromagnetic fields are present in the environment surrounding the exposed copper-based surface, such as plasma-induced ion bombardment, substrate charging and the like, are negligible compared to the pure thermal-chemical effect caused by components of the gaseous environment.

Figure 2A:
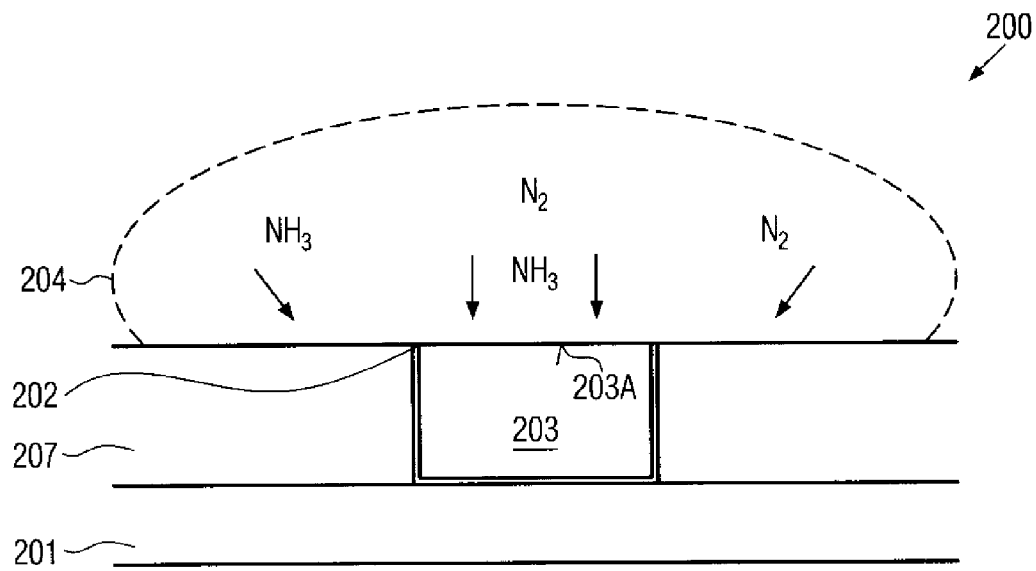
FIGS. 2a-2g schematically show cross-sectional views of the formation of a capping layer for a copper-based metal region on the basis of a thermal-chemical pretreatment according to illustrative embodiments of the present invention.
Figure 2B:
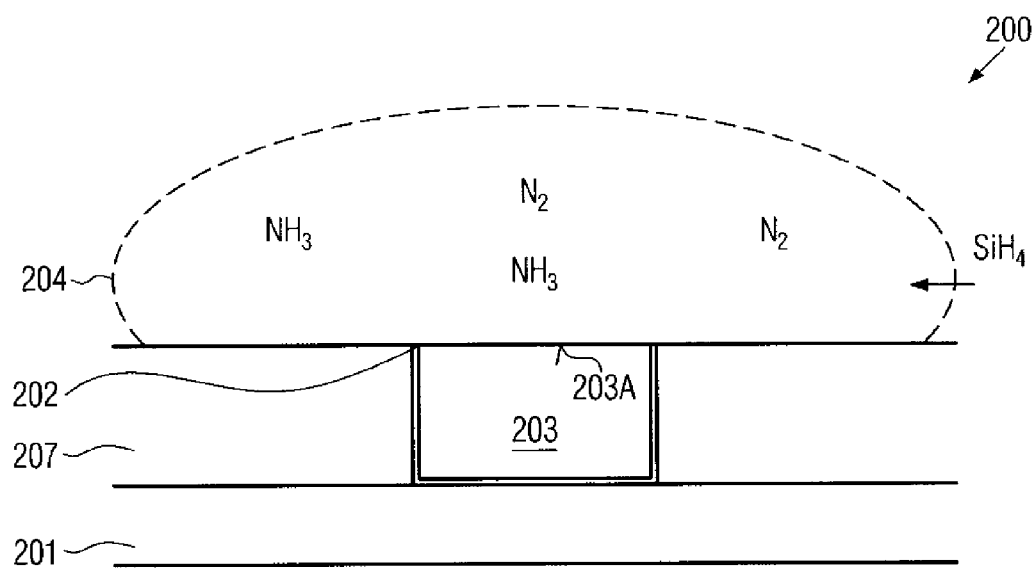
Figure 2C:
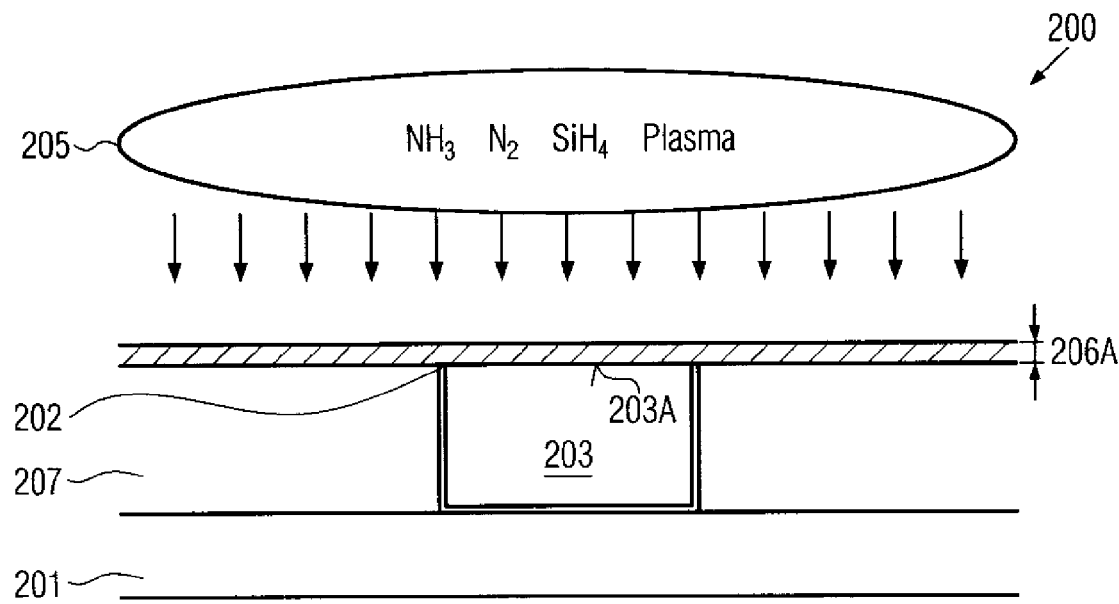

With reference to FIGS. 2a-2c, further illustrative embodiments of the present invention will now be described in more detail. FIG. 2a schematically shows a semiconductor device 200 in cross-sectional view in an advanced manufacturing stage. The semiconductor device 200 may represent a device comprising circuit elements, such as transistors, possibly in combination with other microstructural features for forming mechanical and/or optical components. The device 200 may comprise a substrate 201, which may be provided in the form of a bulk silicon substrate, a silicon-on-insulator (SOI) substrate, or any other appropriate semiconductive or insulating carrier having formed thereon an appropriate semiconductor layer for the formation of circuit elements. For convenience, any such circuit elements are not shown. Moreover, the device 200 may comprise one or more metallization layers including copper-based metal lines and vias, wherein, for convenience, a single metallization layer 207 is shown in FIG. 2a. The metallization layer 207 may be comprised of any appropriate dielectric material including one or more copper-based metal regions 203, wherein the copper-based metal region 203 may represent a metal line embedded in the dielectric material of the layer 207, which may be provided in the form of silicon dioxide, fluorine-doped silicon dioxide, a low-k dielectric material, such as SiCOH, polymer materials, or any combination thereof. The copper-based metal region 203 may comprise a barrier layer 202 formed of any appropriate barrier/adhesion material, such as tantalum, tantalum nitride, titanium, titanium nitride, any combination thereof or any other appropriate materials. Moreover, the barrier layer 202 may be comprised of two or more individual layers of different material composition. The remaining conductive material of the region 203 may be comprised of copper or a copper alloy. The device 200 is shown in a manufacturing sequence, wherein a surface 203a is exposed and is to receive a dielectric barrier or capping layer. Due to any preceding processes, the exposed surface 203a may comprise a plurality of unwanted surface irregularities, such as oxidized, discolored and eroded portions, which are for convenience not shown in FIG. 2a.

A typical process flow for forming the device 200 as shown in FIG. 2a may comprise substantially the same processes as are previously described with reference to the device 100. That is, well-established process techniques may be used for forming any circuit elements and other microstructural features followed by well-established single or dual damascene techniques for forming the metallization layer 207. During the process sequence for forming the metallization layer 207, the surface 203a of the copper-based region 203 may have been exposed, for instance by CMP, so as to provide the copper-based region 203 as an electrically insulated conductive line. Subsequently, the device 200 is treated in a specified environment 204 so as to prepare the exposed copper-containing surface 203a for receiving a capping layer thereon having a high resistance against electromigration. The specified environment 204 may be established by creating a gaseous atmosphere surrounding the exposed surface 203a, wherein the specified environment 204 is established in the absence of a plasma ambient, contrary to conventional strategies, in which the treatment of an exposed copper-based surface includes a plasma treatment prior to the subsequent in situ capping layer deposition.

It should be noted that the specified environment 204 may be established in any appropriate process tool that enables a plasma-based deposition, such as a PECVD tool available from Applied Materials known as Producer™. In one illustrative embodiment, the specified environment 204 is established on the basis of a mixture of ammonia ($NH_3$) and nitrogen ($N_2$) wherein a pressure of approximately 2-6 Torr, for example approximately 4.8 Torr, is created. Moreover, the ratio of ammonia and nitrogen may range from approximately 1:100-1:1, which may be achieved for the above-identified PECVD process tool with flow rates of approximately 100-1,000 sccm, for instance approximately 260 sccm, for ammonia, and approximately 1000-10000 sccm, for instance approximately 8600 sccm, for nitrogen. Moreover, the substrate 201 may be heated to approximately 300-400° C., for instance approximately 370° C., thereby also heating the exposed surface 203a. Upon the interaction of the gas mixture in the specified environment 204, a thermally-induced chemical cleaning process of the surface 203a is achieved. In illustrative embodiments, this step of pretreatment is performed for approximately 5-30 seconds, for instance for approximately 10 seconds.

FIG. 2b schematically shows the semiconductor device 200 in a further advanced stage of thermal-chemical pretreatment of the exposed surface 203a in the absence of a plasma ambient. In this stage, a precursor gas, such as silane ($SiH_4$), for the formation of a silicon nitride capping layer is introduced into the specified environment 204. For example, for the above-specified PECVD process tool, a flow rate of approximately 20-300 sccm, for instance approximately 150 sccm, for the precursor gas may be used. In this phase, the introduced precursor gas may also react with the pretreated exposed surface 203a, wherein it is believed that, due to the missing RF (radio frequency) power that would be or would have been coupled into the surface during a conventional plasma-based pretreatment, any precursor diffusion into copper and copper alloys and the resulting copper silicide formation may significantly be reduced. The specified environment 204 as shown in FIG. 2b may be maintained for approximately 1-20 seconds, and in particular embodiments from approximately 5-10 seconds. Thereafter, a deposition plasma may be established to initiate the actual deposition process for forming a silicon nitride capping layer. Consequently, the pretreatment without any plasma may be performed for a time period of approximately 50 seconds and less, and in other embodiments for approximately 30 seconds and less, immediately followed by the in situ deposition of the capping layer.

FIG. 2c schematically shows the semiconductor device 200 during the deposition of a silicon nitride capping layer 206 by means of a deposition plasma ambient 205. A thickness 206a may be adjusted by controlling respective process parameters for establishing the deposition plasma ambient 205. In one illustrative embodiment using the above-specified PECVD tool, the values or value ranges for the flow rates of the gaseous components of the plasma ambient 205 may be the same as in the environment 204 of FIG. 2b. The values or value ranges for the pressure and the substrate temperature may also be the same as for the environment 204, wherein, however, the actually selected values for the various parameters in the deposition step of the plasma ambient 205 may differ from the corresponding parameter values of the environment 204 of FIG. 2b. The radio frequency power for establishing the deposition plasma ambient 205 may range from approximately 500-600 watts. It should be appreciated that an appropriate power density for establishing a plasma for other tool geometries and chamber configurations may readily be determined on the basis of the RF power specified before. With the values for the temperature, the flow rates and the pressure as specified above with reference to the environment 204 shown in FIG. 2b as illustrative examples, a value of approximately 50 nm for the thickness 206a may be achieved with a deposition time of approximately 11 seconds.

After a target thickness for the layer 206 is achieved, the supply of RF power may be discontinued and a purge step may be performed on the basis of nitrogen, wherein, in an illustrative example, a purge time of approximately 10 seconds with a nitrogen flow rate of approximately 8600 sccm may be performed. Thereafter, a pump step may be performed, wherein any supply of gaseous components is discontinued. For example, a pump step of approximately 15 seconds may be performed.

As a consequence, the silicon nitride capping layer 206 may be formed with a thickness of, for instance, approximately 10-100 nm, wherein an interface, which for convenience is also referred to as 203a, with the copper-based region 203 exhibits excellent characteristics with respect to adhesion and electromigration, wherein additionally a significant reduction of process time may be achieved compared to conventional capping layer formation sequences comprising a plasma-based pretreatment.

Figure 2D:
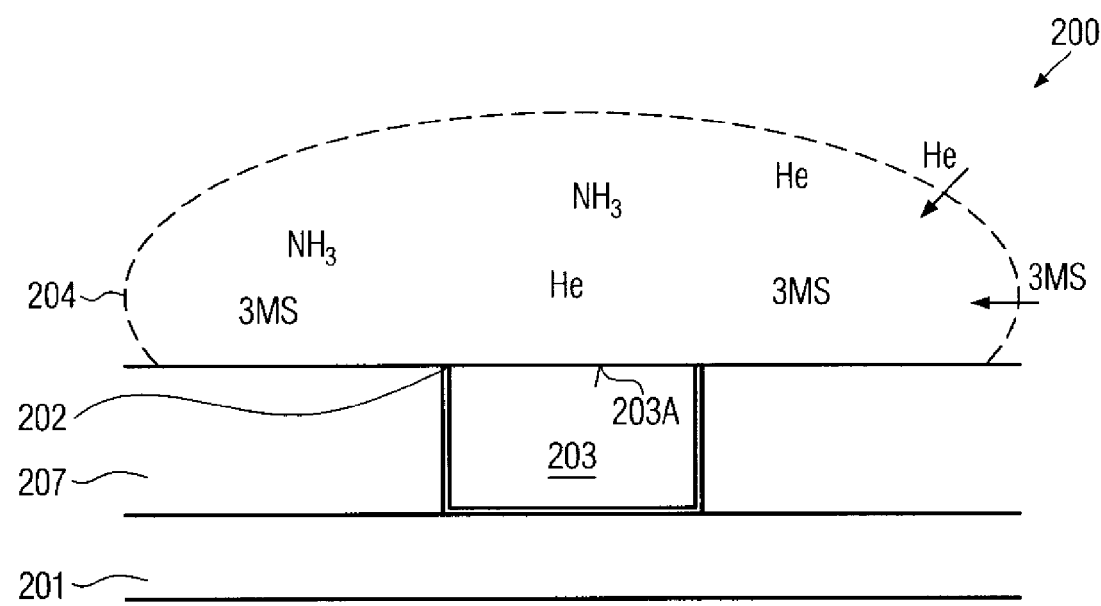

FIG. 2d schematically shows the semiconductor device 200 according to further illustrative embodiments, wherein, starting from the device as shown in FIG. 2a, i.e., subjected to the specified environment 204 of FIG. 2a including ammonia and nitrogen as chemically active components, the environment 204 in FIG. 2d, after the a first phase of cleaning the surface according to the process in FIG. 2a, is different in composition, in that the supply of nitrogen is discontinued while helium may be supplied as an inert carrier and 3MS may be introduced as a precursor for the formation of a nitrogen enriched silicon carbide (SiCN) layer.

In one illustrative embodiment, for the pretreatment in the environment 204 as shown in FIG. 2a prior to introducing helium and 3MS into the environment 204 as shown in FIG. 2d, substantially the same process parameter value ranges may be used as are described with reference to FIG. 2a. In an exemplary embodiment, the cleaning step as shown in FIG. 2a may be based on the following illustrative and exemplary values for the following parameters: a temperature of approximately 370° C. for the substrate 201, a pressure of approximately 3 Torr and flow rates of approximately 325 sccm and approximately 1000 sccm for ammonia and nitrogen, respectively. The chemical treatment may be performed for approximately 20 seconds. It should be appreciated that these exemplary values as well as the value ranges described above may be appropriate for the above-specified PECVD tool and may readily be adapted to other tool configurations on the basis of the technical teaching provided in this specification.

The environment 204 as shown in FIG. 2d that is configured to enable the subsequent in situ deposition of a nitrogen enriched silicon carbide layer may be established on the basis of the following parameter values for the above-specified PECVD tool. The pressure may range from approximately 2-6 Torr, for example approximately 3 Torr, the temperature of the substrate 201 may range from approximately 300-400° C., for example approximately 370° C., and the flow rates for 3MS, ammonia and helium, respectively, may be from approximately 20-300 sccm, for example approximately 160 sccm, from approximately 100-1000 sccm, for instance approximately 325 sccm, and from approximately 100-1000 sccm, for example approximately 400 sccm. A process time for this exposure and precursor stabilization step may range from approximately 1-20 seconds, for example approximately 10 seconds. Thereafter, RF power may be supplied to the environment 204 to establish an in situ deposition plasma ambient.

Figure 2E:
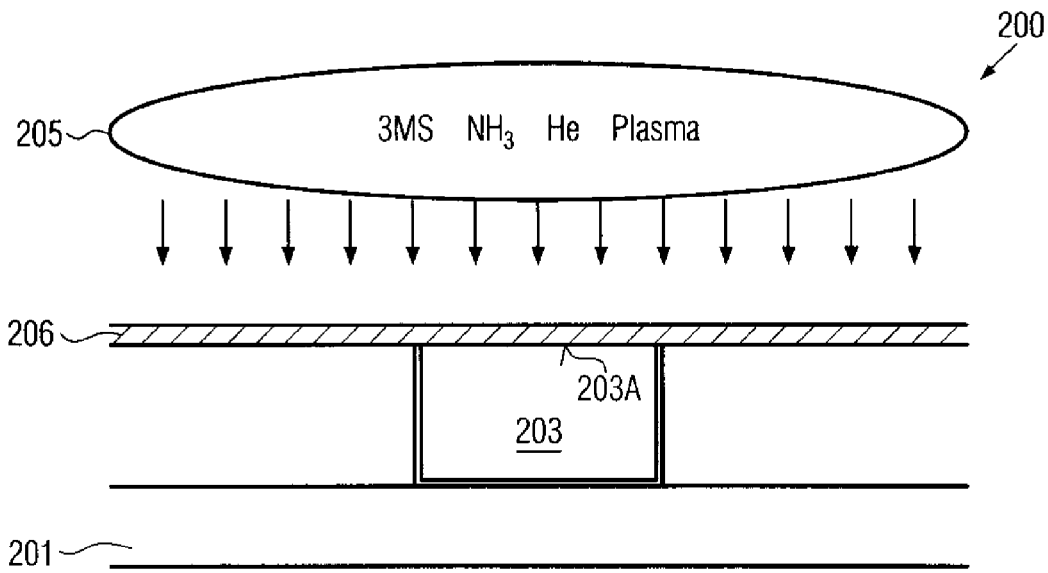

FIG. 2e schematically shows the plasma ambient 205 so as to initiate the in situ deposition of the capping layer 206, which is now comprised of nitrogen enriched silicon carbide (SiCN). With an RF power of approximately 300 watts and a deposition time of approximately 21.5 seconds and using the exemplary values for temperature, pressure and flow rates as specified above for the environment 204 of FIG. 2d, a thickness of approximately 50 nm may be obtained. Thereafter, a final pump step, for instance for approximately 15 seconds, may be performed, thereby removing any unwanted deposition by-products. Similarly, as explained with reference to the silicon nitride capping layer 206 of FIG. 2c, the SiCN capping layer 206 of FIG. 2e also has the improved interface 203a, which exhibits a significantly enhanced resistance against electromigration effects compared to a conventionally formed SiCN capping layer.

Figure 2F:
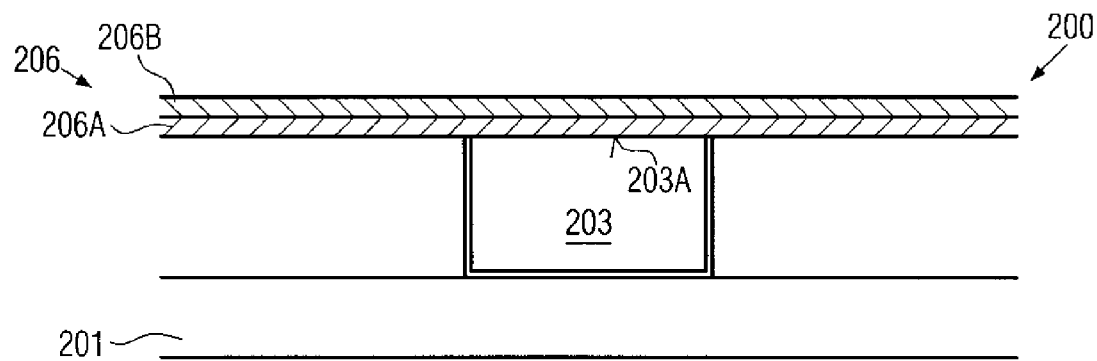

FIG. 2f schematically shows the semiconductor device 200 in accordance with still further illustrative embodiments, wherein the capping layer comprises a first sub-layer 206a and a second sub-layer 206b. For example, the sub-layer 206a may be comprised of silicon nitride, while the second sub-layer 206b may be comprised of nitrogen enriched silicon carbide. In other embodiments, the sub-layer 206a may be comprised of SiCN, while the sub-layer 206b may be comprised of silicon nitride. The capping layer 206 as shown in FIG. 2f may be formed on the basis of the process sequences described above with reference to FIGS. 2a-2e, wherein a thermal-chemical pretreatment is performed in the specified environment 204 without applying any plasma, wherein, in one illustrative embodiment, the pretreatment is performed as is described with reference to FIGS. 2a and 2b so that, after the thermal-chemical pretreatment, a deposition of silicon nitride may be initiated by establishing in situ the deposition plasma ambient 205 as shown in FIG. 2c. After a desired target thickness for the sub-layer 206a provided in the form of a silicon nitride layer is achieved, the supply of RF power may be discontinued and the plasma ambient 205 as shown in FIG. 2e may be established so as to initiate the deposition of the sub-layer 206b in the form of a SiCN layer. Similarly, the above-described process sequence may be inverted with respect to the steps performed after the cleaning process described with reference to FIG. 2a so as to form an SiCN/SiN layer stack.

Figure 2G:
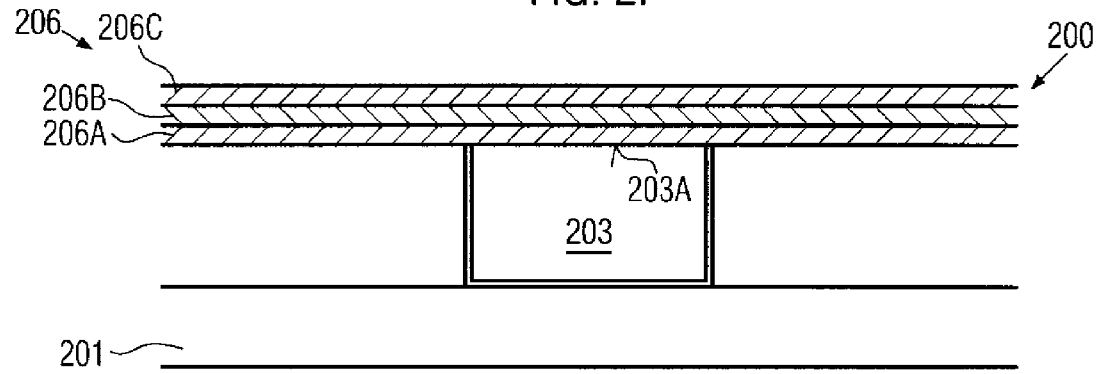

FIG. 2g schematically shows the semiconductor device 200 according to a further illustrative embodiment, wherein the capping layer 206 may include three sub-layers 206a, 206b and 206c. For example, the sub-layers 206a and 206c may represent SiCN layers, while the sub-layer 206b may represent an SiN layer. In other embodiments, the sub-layers 206a and 206c may represent SiN layers, while the sub-layer 206b may represent an SiCN layer. Regarding the formation of the capping layer 206 as shown in FIG. 2g, the same processes may be used as described with reference to FIG. 2f, wherein, additionally, a further deposition plasma ambient may be established to form the additional sub-layer 206c. However, contrary to the embodiments of FIG. 2f, in FIG. 2g, the thickness of the individual sub-layers 206a, 206b and 206c may be appropriately selected so as to achieve a desired total thickness of the capping layer 206 in accordance with device requirements. Thus, the sub-layers 206a, 206b and 206c may in general have a reduced thickness compared to the sub-layers 206a and 206b of FIG. 2f for the semiconductor device 200 having otherwise substantially the same configuration. The described process sequence may be extended to form more than three sub-layers in the capping layer 206.

As a result, the present invention provides an improved technique for forming a dielectric barrier or capping layer for copper-based metal regions as are typically encountered in highly sophisticated semiconductor devices including a highly conductive copper-based metallization layer. Contrary to conventional approaches, a high quality interface between the copper-based metal and a capping layer is achieved by a thermal-chemical pretreatment prior to the subsequent in situ deposition of the capping layer. This effect is believed to be caused by slight controllable precursor diffusion into a copper-based metal region during the precursor introduction into the gaseous environment prior to the actual deposition. Subsequently, an interface of extreme high mechanical stability is formed. On the other hand, a diffusion into the copper bulk and subsequently a non-desired modification of the copper line, such as silicide formation in the copper volume, can be avoided by the new art of pretreatment. Significantly enhanced resistance against electromigration can be obtained, resulting in approximately 3-5 times improved electromigration performance in terms of lifetime compared to a conventional SiCN capping layer formed on the basis of an RF plasma ambient. Furthermore, good adhesion of the capping layer according to the present invention on the copper-based metal is achieved. For instance, the coefficient $G_c$, may be in the range of approximately 10-40 $J/m^2$. In addition to the enhanced electromigration performance, the generation rate of copper hillocks is significantly reduced, because no RF power is heating the uncapped copper surface during the pretreatment, which is a characteristic of the conventional art of pretreatment. As an additional benefit, a significant reduction of process time is also achieved, thereby increasing throughput and reducing production costs.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising: forming a copper-based metal region in a dielectric layer of a metallization layer of a semiconductor device, said copper-based metal region having an exposed surface; cleaning said exposed surface by means of a thermal-chemical treatment in a specified environment in the absence of a cleaning plasma ambient; and depositing a capping layer on said exposed surface, wherein no said cleaning plasma ambient is established prior to establishing a deposition plasma ambient to initiate deposition of said capping layer.

2. The method of claim 1, wherein depositing said capping layer comprises establishing said disposition plasma immediately after exposure to said specified environment to initiate in situ the deposition process.

3. The method of claim 2, wherein said thermal-chemical treatment further comprises supplying a precursor gas into said specified environment prior to establishing said deposition plasma ambient.

4. The method of claim 1, wherein performing said thermal-chemical treatment comprises supplying ammonia and nitrogen into said specified environment and heating said exposed surface.

5. The method of claim 3, wherein said precursor gas comprises tri-methyl silane.

6. The method of claim 3, wherein said precursor gas comprises silane.

7. The method of claim 4, wherein a first precursor gas and a second precursor gas are sequentially supplied to said specific environment.

8. The method of claim 1, wherein a process time of said thermal-chemical treatment is less than approximately 50 seconds.

9. The method of claim 8, wherein a process time of said thermal-chemical treatment is less than approximately 30 seconds.

10. The method of claim 8, wherein a precursor gas is supplied to said specific environment during said thermal-chemical treatment for a time period of approximately 20 seconds or less immediately prior to establishing said plasma deposition ambient for depositing said capping layer.

11. A method, comprising: providing a semiconductor device comprising a substrate having formed thereon a copper-based metal region having an exposed surface; pretreating said exposed surface in the absence of a cleaning plasma ambient by supplying ammonia ($NH_3$) and nitrogen ($N_2$) and heating said exposed surface for receiving a capping layer; and depositing in situ said capping layer in the presence of a deposition plasma ambient, wherein no said cleaning plasma ambient is established prior to establishing said deposition plasma ambient to initiate deposition of said capping layer.

12. The method of claim 11, wherein pretreating said exposed surface comprises supplying a silicon-containing precursor gas to said exposed surface.

13. The method of claim 12, wherein said deposition plasma ambient is created after supplying said silicon-containing precursor gas for approximately 20 seconds or less.

14. The method of claim 11, wherein pretreating said exposed surface is performed for a time period of approximately 50 seconds or less.

15. The method of claim 14, wherein pretreating said exposed surface is performed for a time period of approximately 30 seconds or less.

16. The method of claim 12, wherein said silicon-containing precursor gas comprises at least one of tri-methyl silane and silane.

17. The method of claim 12, wherein at least one further precursor gas is supplied in the presence of said deposition plasma ambient.

* * * * *

UNITED STATES PATENT AND TRADEMARK OFFICE
CERTIFICATE OF CORRECTION

| | | |
|---|---|---|
| PATENT NO. | : 7,491,638 B2 | Page 1 of 1 |
| APPLICATION NO. | : 11/383824 | |
| DATED | : February 17, 2009 | |
| INVENTOR(S) | : Joerg Hohage, Matthias Lehr and Volker Kahlert | |

It is certified that error appears in the above-identified patent and that said Letters Patent is hereby corrected as shown below:

Col. 11, line 53 (claim 2, line 2), delete "disposition" and insert therefor -- deposition --.

Col. 12, line 32 (claim 11, line 6), after "exposed surface" insert -- to prepare said exposed surface --.

Signed and Sealed this

Twenty-fourth Day of March, 2009

JOHN DOLL
*Acting Director of the United States Patent and Trademark Office*